United States Patent [19]
Gregoire et al.

[11] Patent Number: 5,939,790
[45] Date of Patent: Aug. 17, 1999

[54] INTEGRATED CIRCUIT PAD STRUCTURES

[75] Inventors: Francois Gregoire, Cupertino; Raminda Madurawe, Sunnyvale; Guru Thalapaneni, Fremont, all of Calif.

[73] Assignee: Altera Corporation, San Jose, Calif.

[21] Appl. No.: 08/631,667

[22] Filed: Apr. 9, 1996

[51] Int. Cl.⁶ .............................. H01L 23/48; H01L 21/60
[52] U.S. Cl. .................. 257/773; 257/784; 257/786; 438/612; 438/622
[58] Field of Search ..................................... 438/666, 637, 438/633, 622, 618, 612; 257/786, 784, 773

[56] References Cited

U.S. PATENT DOCUMENTS

| | | | |
|---|---|---|---|
| 4,609,986 | 9/1986 | Hartmann et al. | 364/20 C |
| 4,617,479 | 10/1986 | Hartmann et al. | 307/465 |
| 4,677,318 | 6/1987 | Veenstra | 307/465 |
| 4,713,792 | 12/1987 | Hartmann et al. | 364/900 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen | 307/465 |
| 5,149,674 | 9/1992 | Freeman, Jr. et al. . | |
| 5,155,065 | 10/1992 | Schweiss . | |
| 5,220,214 | 6/1993 | Pedersen | 307/465 |
| 5,260,610 | 11/1993 | Pedersen et al. | 307/465 |
| 5,260,611 | 11/1993 | Cliff et al. | 307/465 |
| 5,350,954 | 9/1994 | Patel | 307/465 |
| 5,371,422 | 12/1994 | Patel et al. | 326/41 |
| 5,739,587 | 4/1998 | Sato . | |

OTHER PUBLICATIONS

R.C. Minnick, "A Survey of Microcellular Research," Journal of the Association for Computing Machinery, vol. 14, No. 2, pp. 203–241, Apr. 1967.

S.E. Wahlstrom, "Programmable Logic Arrays—Cheaper by the Millions," Electronics, Dec. 11, 1967, pp. 90–95.

Recent Developments in Switching Theory, A. Mukhopadhyay, ed., Academic Press, New York, 1971.

Carter W. Kaanta, et al "Dual Damascene: A ULSI Wiring Technology" 1991 Proc. 8th International VLSI Multilevel Interconnect Conf. pp. 144–152, Jun. 1991.

*Primary Examiner*—Caridad Everhart
*Attorney, Agent, or Firm*—Fish & Neave; Robert R. Jackson; G. Victor Treyz

[57] ABSTRACT

Pad structures for an integrated circuit are provided that use via holes or slots rather than large pad openings to form electrical connections between successive metal interconnection layers. The via holes or slots are filled using standard metal etchback deposition techniques. The pad structures minimize particle generation during circuit fabrication. A number of the via holes or slots in the pad structure can be interconnected in parallel to provide a sufficient current handling capacity to distribute power to the active components on the integrated circuit.

26 Claims, 7 Drawing Sheets

INTEGRATED CIRCUIT PAD STRUCTURES

BACKGROUND OF THE INVENTION

This invention relates to pad structures for integrated circuits, and more particularly, to structures that allow patterns of via holes to be used to provide electrical connections between successive integrated circuit metal layers in the vicinity of a pad.

Integrated circuits typically have pads to which electrical connections are made when the circuit is mounted in a package. Leads are wire bonded between appropriate portions of the package and the pads. Signals on an integrated circuit are routed between active circuitry and the pads using patterned metal interconnection layers separated by insulating layers. Some portions of the metal interconnection layers form data lines for routing signals between various active circuit components. Other portions of the metal interconnection layers form lines to carry signals between active circuitry and the pads, which are also formed from the metal interconnection layers.

Metal lines are connected through narrow via holes in the insulating layers that separate metal interconnection layers. Metal can be deposited in these narrow via holes using a technique known as etchback deposition. Metal interconnection layers are also connected when forming conventional pad structures.

To form conventional pad structures, relatively large pad openings are generally formed in the insulating layers that separate metal interconnection layers. As each metal interconnection layer is deposited, it makes an electrical connection with an underlying metal interconnection layer through the pad opening. The pad openings for this type of conventional pad structure are large, which allows such structures to carry relatively high currents between interconnection layers without consuming surface area elsewhere on the integrated circuit. However, the large size of the pad openings creates problems during circuit fabrication. When the large pad openings are exposed to the metal etchback deposition process used to fill via holes, slivers of excess metal are produced along the sidewalls of the pad openings. The metal slivers generate particles, which are highly undesirable during the circuit fabrication process.

It is therefore an object of the present invention to provide integrated circuit pad structures that can be fabricated with minimal particle generation.

It is a further object of the present invention to provide integrated circuit pad structures that allow the electrical connections made between successive metal interconnection layers in the vicinity of a pad to be formed using various patterns of metal-filled via holes.

SUMMARY OF THE INVENTION

These and other objects of the invention are accomplished in accordance with the principles of the present invention by providing integrated circuit pad structures in which metal-filled via holes or slots are connected in parallel in the immediate vicinity of the pads of an integrated circuit to provide electrical pathways between active circuitry and the pads. The metal-filled via holes or slots provide relatively high-capacity electrical pathways to the pads without necessitating the creation of large pad openings in the insulating layers on the circuit that can lead to the generation of particles during circuit fabrication.

One approach for providing connections to the pads involves connecting successive metal interconnection layers with metal-filled via holes or slots in ring patterns surrounding each pad. Each ring pattern of via holes or slots connects a pair of metal interconnection layers. The portions of the metal interconnection layers directly beneath the pad can form pad openings that are completely filled with planarizing insulating layers. Alternatively, the metal interconnection layers can form undisturbed portions that span the area beneath the pad. These portions of the metal interconnection layers are also covered with planarizing insulating layers. Another approach involves forming arrays of metal-filled via holes or slots beneath the pad. Each array connects a pair of metal interconnection layers over a relatively wide area. A hybrid approach is possible in which different patterns of via holes or slots are used between different metal interconnection layers.

Further features of the invention, its nature and various advantages will be more apparent from the accompanying drawings and the following detailed description of the preferred embodiments.

DETAILED DESCRIPTION OF THE PREFERRED EMBODIMENTS

Figure 1A:
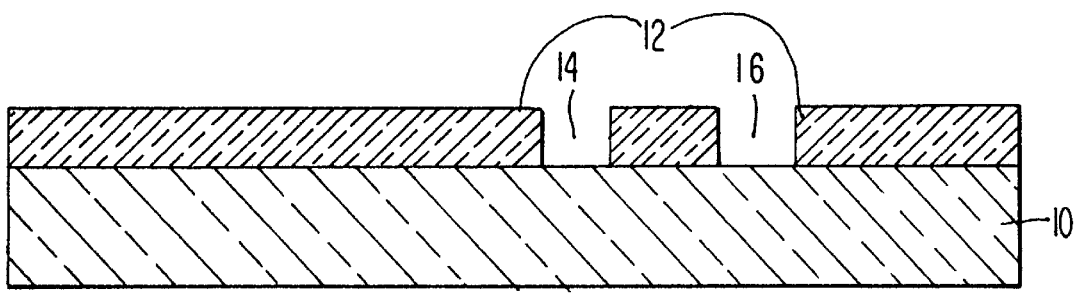
FIG. 1(a) is a cross sectional view of a partially formed conventional pad structure.

FIG. 1 shows some of the steps involved in fabricating the metal interconnection layers that are used to route signals on a conventional integrated circuit. As shown in FIG. 1(a), after the active components of the circuit have been fabricated, silicon substrate 10 is coated with an insulating layer of borophosphosilicate glass (BPSG) 12. BPSG layer 12 is patterned using standard etching techniques to provide contact holes 14 and 16.

Figure 1B:
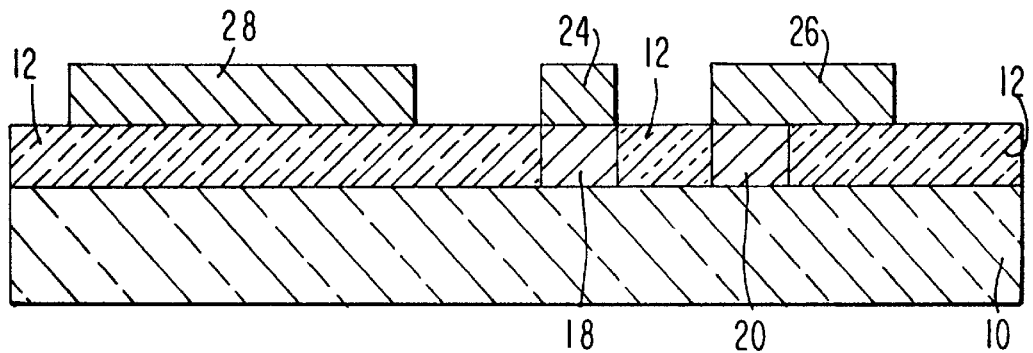
FIG. 1(b) is a cross sectional view of the pad structure of FIG. 1(a) following additional processing steps.

With modern semiconductor fabrication processes, contact holes 14 and 16 typically have lateral dimensions of about 0.5 $\mu$m. A tungsten etchback deposition process is required to fill holes 14 and 16 due to their small size. The etchback deposition process, which involves blanket deposition of tungsten followed by etching, fills holes 14 and 16 with tungsten plugs 18 and 20, which have planarized upper surfaces that are vertically aligned with the upper surface of BPSG layer 12, as shown in FIG. 1(b).

A metal layer is deposited and patterned on BPSG layer 12 and plugs 18 and 20 to form interconnections 24 and 26 and pad layer 28. Typically, the lateral dimensions of pad layer 28 are about 100 $\mu$m. Interconnections 24 and 26 are electrically connected to tungsten plugs 18 and 20. Pad layer 28 is used to form the bottom layer of a multilayered metal bonding pad. In subsequent fabrication steps, additional metal layers are deposited on top of pad layer 28 to form a complete bonding pad.

Figure 1C:
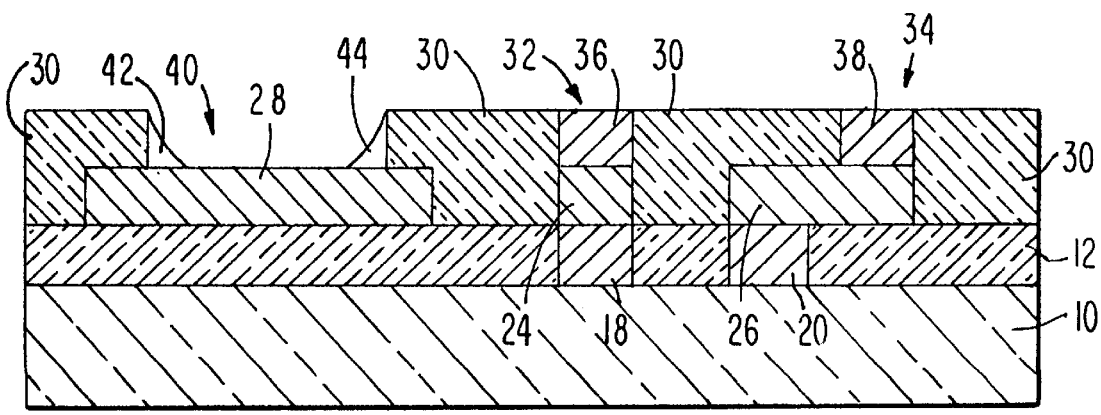
FIG. 1(c) is a cross sectional view of the pad structure of FIG. 1(b) following additional processing steps.

In order to provide a suitable insulating layer between the metal interconnection layer containing interconnections 24 and 26 and subsequently deposited metal interconnection layers, a planarizing insulating layer 30 is deposited on top of pad layer 28 and interconnections 24 and 26, as shown in FIG. 1(c). Planarizing insulating layer 30 is patterned to form via holes 32 and 34 for connecting subsequent metal interconnection layers with interconnections 24 and 26. Via holes 32 and 34 are filled using a tungsten etchback deposition process, which forms tungsten plugs 36 and 38. Planarizing insulating layer 30 is also patterned in the region above pad layer 28. A window 40 with lateral dimensions slightly smaller than those of pad layer 28 is formed through planarizing insulating layer 30 to allow subsequent metal pad layers to be deposited on top of pad layer 28. If the lateral dimensions of pad layer 28 are 100 $\mu m \times 100$ $\mu m$, typical lateral dimensions for window 40 are 90 $\mu m \times 90$ $\mu m$.

Due to the relatively large lateral dimensions of window 40, the tungsten etchback deposition process used to fill via holes 32 and 34 with tungsten plugs 36 and 38 does not result in the formation of a planarized tungsten layer in window 40. Rather, most of the tungsten deposited during the blanket-deposition phase of the tungsten etchback deposition process is removed during the etchback phase. The tungsten layer deposited in window 40 is removed during etchback due to the open geometry of window 40, whereas tungsten plugs 36 and 38 remain in via holes 32 and 34 following etchback due to the constricted geometry of via holes 32 and 34.

The removal of the tungsten layer in window 40 creates a height differential between planarizing insulating layer 30 and pad layer 28 that can lead to step coverage problems when forming additional metal interconnection layers. More significantly, subjecting the tungsten in window 40 to the etchback step results in residual tungsten slivers 42 and 44 on the sidewalls around the periphery of window 40. Slivers 42 and 44 are formed because the plasma etching process used to perform the tungsten etchback step is not effective on vertical surfaces. Slivers 42 and 44 can lead to the formation of particles during subsequent processing steps. Because particle generation must be minimized in modern fabrication processes, it is generally unacceptable to allow features such as slivers 42 and 44 to be formed during circuit fabrication.

In accordance with the present invention, integrated circuit bonding pad structures are formed without producing features such as slivers 42 and 44 that could lead to particle generation during the fabrication process. A variety of arrangements may be used to form the pad structures of the present invention. The arrangements each involve forming electrical pathways between bonding pads on the top surface of an integrated circuit and electrical circuitry on the circuit substrate in the vicinity of the pads using a number of small via holes or narrow slots in place of large pad openings in the insulating layers of the circuit.

Figure 2:
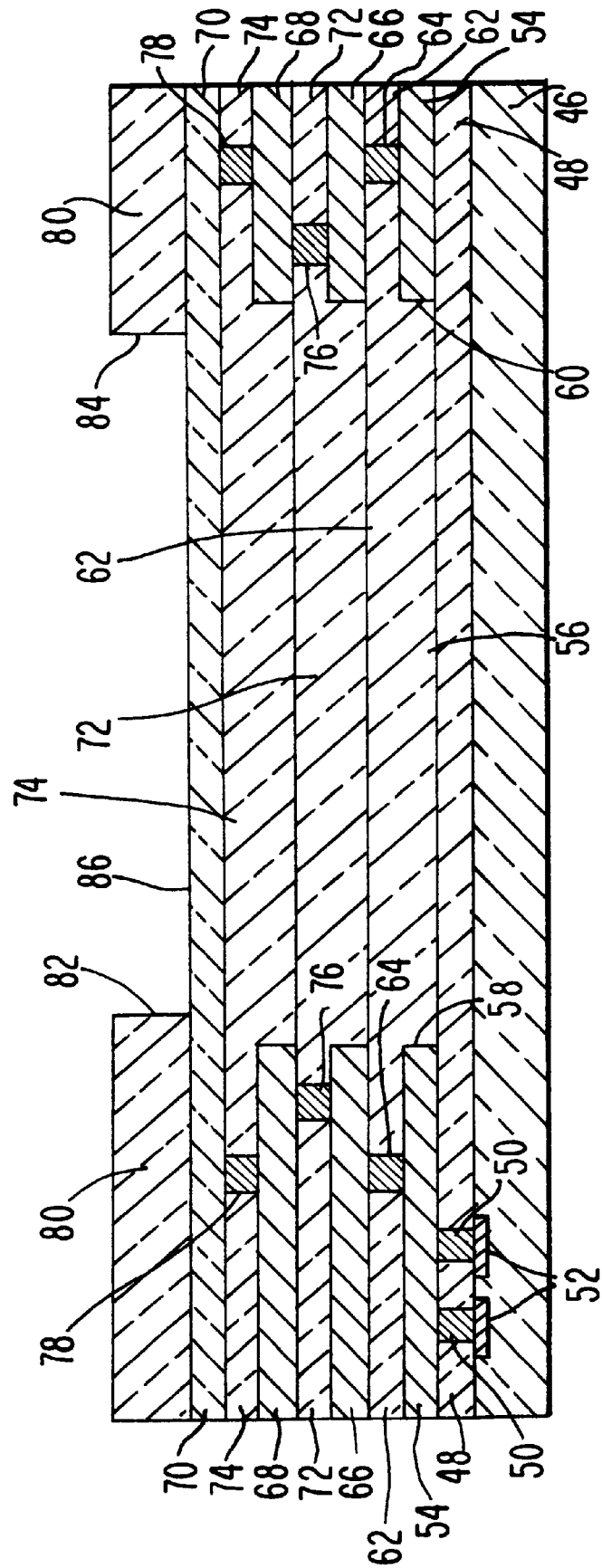
FIG. 2 is a cross sectional view of a pad structure in accordance with the present invention.

A representative bonding pad structure 45 is shown in FIG. 2. A suitable semiconductor substrate such as silicon substrate 46 is coated with insulating layer 48, which is preferably a borophosphosilicate glass (BPSG) layer. Bonding pad structure 45 is preferably formed on a portion of silicon substrate 46 that has a conventional field oxide layer (not shown). Insulating layer 48 is patterned using standard etching techniques to provide conductive contact holes 50, which may be filled with a conductive material using any suitable via filling process, such as a conventional tungsten etchback deposition process. Tungsten etchback deposition fills contact holes 50 with tungsten plugs that form electrical connections with active circuit components 52 on the surface of substrate 46, The lateral dimensions of contact holes 50 are preferably about 0.5 $\mu m$. In general, active circuit components, such as components 52, are laterally separated by 10–20 $\mu m$ from the area in which wire bonds are formed to avoid averse effects due to mechanical stress.

After contact holes 50 are formed, metal interconnection layer 54 is deposited. Preferably, metal interconnection layer 54 is formed using a 0.6 $\mu m$ to 0.7 $\mu m$ thick standard metallization layer based on an aluminum alloy. Metal interconnection layer 54 is patterned so that metal interconnection layer 54 can perform the signal routing functions of a conventional integrated circuit first metallization layer. In addition, a relatively large section of interconnection layer 54 is removed to form pad area 56, which extends from left sidewall 58 of interconnection layer 54 to right sidewall 60 of interconnection layer 54, Pad area 56 preferably has lateral dimensions of approximately the size of a bonding pad, e.g., about 100 $\mu m$.

Interconnection layer 54 is covered with planarizing insulating layer 62, which is preferably a 0.5 $\mu m$ to 1.0 $\mu m$ thick silicon oxide layer that has been planarized using a standard chemical-mechanical polish. Alternatively, planarizing insulating layer 62 may be formed using a suitable spin-on glass. Via holes 64 are etched in planarizing insulating layer 62 using standard etching techniques. Preferably, via holes 64 have lateral dimensions on the order of 0.5 $\mu m$ and are filled using a standard tungsten etchback deposition process. Because planarizing insulating layer 62 occupies pad area 56, no slivers of tungsten are formed around the periphery of pad area 56 following the tungsten etchback deposition process used to form via holes 64.

A typical integrated circuit design uses several metal interconnection layers to provide sufficient resources for routing signals on the circuit. In FIG. 2, metal interconnection layers 66, 68, and 70 are formed on top of planarizing insulating layers 62, 72, and 74, respectively. Metal interconnection layers 66, 68, and 70 are patterned to remove the portion of metal interconnection layers 66, 68, and 70 on top of pad area 56, Metal interconnection layers 66 and 68 are preferably formed using a 0.6 $\mu m$ to 0.7 $\mu m$ thick standard metallization layer based on an aluminum alloy. Metal interconnection layer 70 is similar to metal interconnection layers 66 and 68, but preferably has a thickness of approximately 1.0 $\mu m$. Planarizing insulating layers 62, 72, and 74 are preferably 0.5 $\mu m$ to 1.0 $\mu m$ thick silicon oxide layers that are planarized using a standard chemical-mechanical polish.

Via holes 64, 76, and 78 form electrical connections between metal interconnection layers 54, 66, 68, and 70, Preferably, via holes 64, 76, and 78 have lateral dimensions that are small enough to ensure that via holes 64, 76, and 78 can be filled using a standard tungsten etchback deposition process. The lateral displacement of via holes 64, 76, and 78 may be staggered as shown in FIG. 2 to provide a structure with good shock absorption properties. Staggered via holes may also provide a structure that planarizes well using spin-on-glass insulating layers.

If desired, passivation layer 80 can be deposited and patterned on top of metal interconnection layer 70, Passivation layer 80 may be a 0.6 $\mu m$ to 0.7 $\mu m$ thick layer of silicon nitride covered with a 3.0 μm to 4.0 μm thick layer of polyimide. The area between passivation layer sidewall 82 on the left of FIG. 2 and passivation layer sidewall 84 on the right of FIG. 2 defines pad surface area 86. Via holes 64, 76, and 78 are preferably laterally spaced within about 5–10 μm from sidewalls 82 and 84.

Prior to packaging an integrated circuit containing bonding pad structure 45, electrical contact is made with pad surface area 86. A lead is preferably wire bonded to pad surface area 86 using conventional wire bonding techniques. The current carrying capability of bonding pad structure 45 is determined by the number of via holes 64, 76, and 78 that are provided between each metal interconnection layer. If pad structure 45 is used to provide power to the circuit, a relatively large number of via holes 64, 76, and 78 are needed between metal interconnection layers 54, 66, 68, and 70 to ensure that pad structure 45 has a sufficient current carrying capability. An advantage of the arrangement of pad structure 45 is that, because via holes 64, 76, and 78 are formed in the immediate vicinity of pad surface area 86, it is not necessary to use surface area elsewhere on the integrated circuit to interconnect metal interconnection layers 54, 66, 68, and 70.

Figure 3:
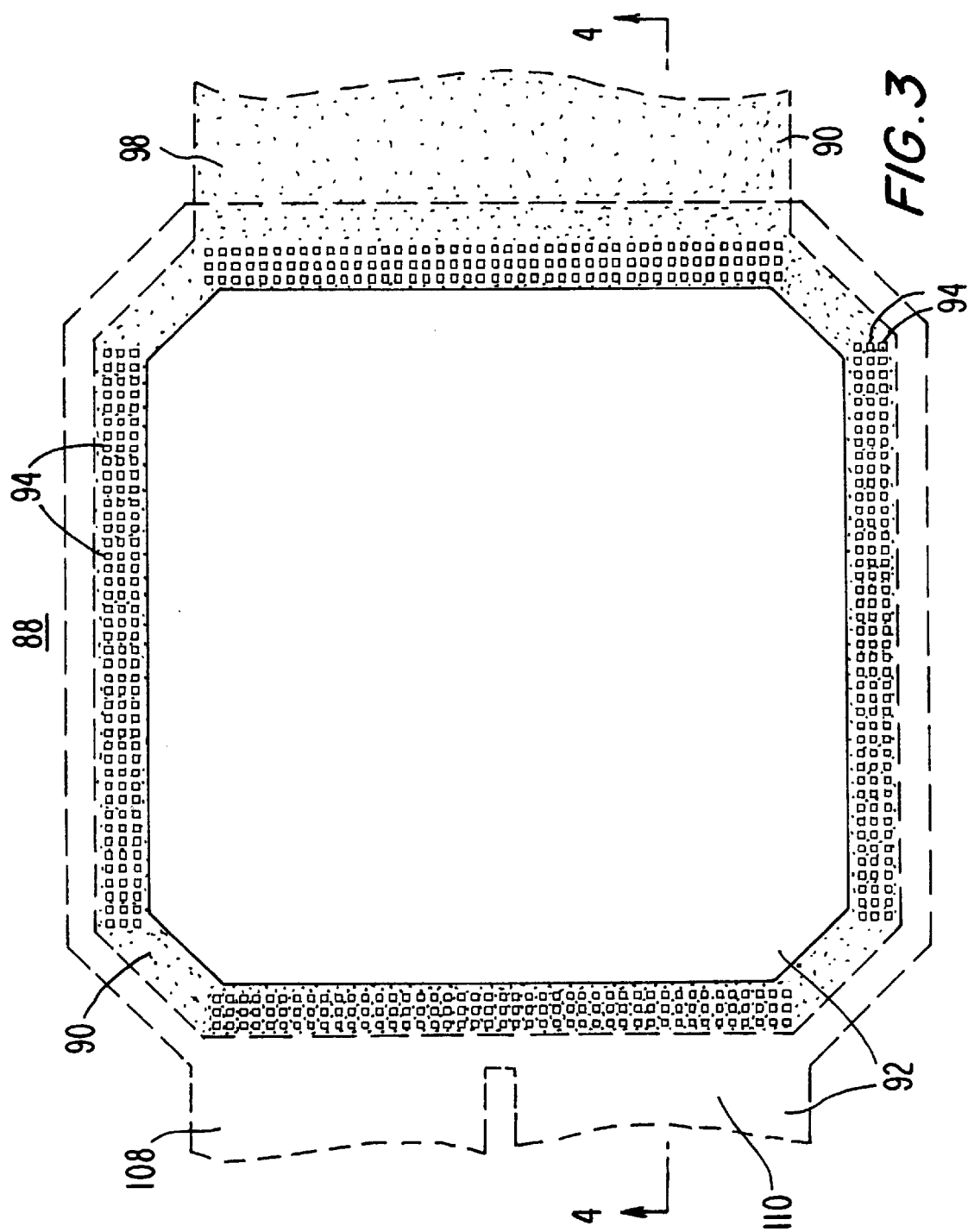
FIG. 3 is a plan view of a pad structure similar to the structure of FIG. 2.
Figure 4:
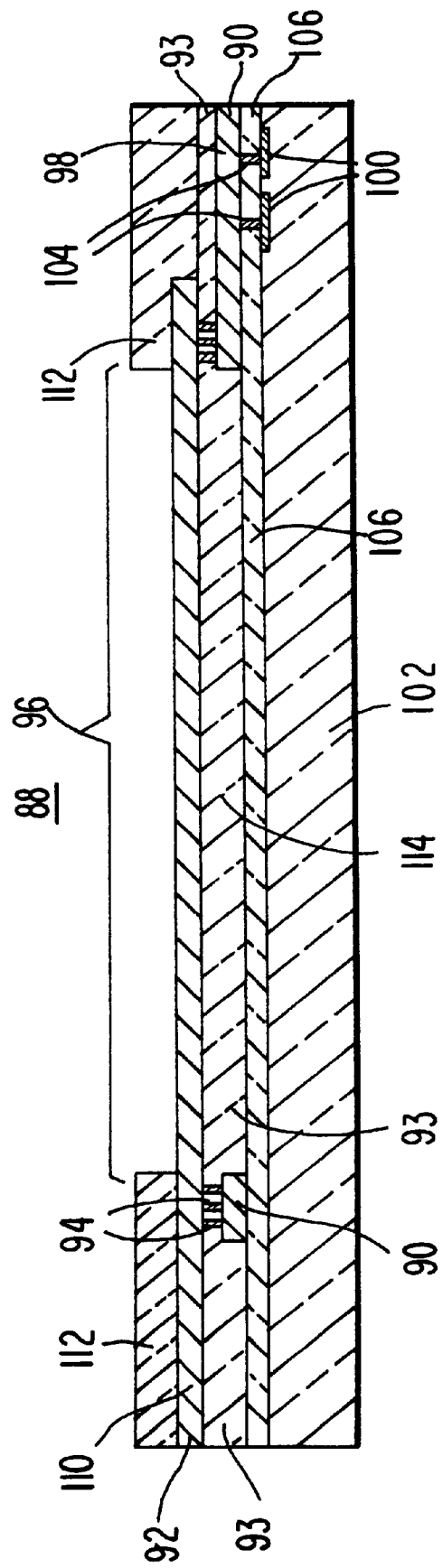
FIG. 4 is a cross sectional view of the pad structure of FIG. 3.

A pad structure 88 with a sufficient quantity of via holes to carry relatively high currents is shown in FIGS. 3 and 4. Pad structure 88 is similar to pad structure 45 of FIG. 2, except that pad structure 88 has two metal layers (metal interconnection layers 90 and 92), whereas pad structure 45 has four metal layers (metal interconnection layers 54, 64, 68, and 70). Metal interconnection layers 90 and 92 are separated by planarizing insulating layer 93. Metal-filled via holes 94 are arranged in four groups surrounding the periphery of pad area 96. Each group of via holes 94 is made up of three rows, each having 43 via holes 94.

Metal-filled via holes 94 conduct current from metal interconnection layer 92 in the vicinity of pad area 96 to metal interconnection layer 90, which forms a ring around the periphery of pad area 96.

Power may be supplied to the circuitry using any suitable power distribution arrangement. For example, bus 98 can be formed from a portion of metal interconnection layer 90 that extends from the central ring portion of metal interconnection layer 90. Bus 98 distributes power to active components 100 on silicon substrate 102 using metal-filled conductive contact holes 104 in insulating layer 106. Similarly, bus 108 and bus 110 are formed from portions of metal interconnection layer 92 that extend outwardly from the portions of metal interconnection layer 92 in central pad area 96, Buses 108 and 110 distribute power using via holes and portions of metal interconnection layer 90.

Passivation layer 112, which is preferably a 0.6 μm to 0.7 μm thick layer of silicon nitride covered with a 3.0 μm to 4.0 μm thick layer of polyimide, is provided to protect pad structure 88 and to provide a good mechanical interface to the package in which the integrated circuit using pad structure 88 is mounted.

Metal interconnection layer 90 is preferably a 0.6 μm to 0.7 μm thick standard metallization layer based on an aluminum alloy. Metal interconnection layer 92 is formed using the same metallization as metal interconnection layer 90, but is preferably 1.0 μm thick. Via holes 94 and contact holes 104 have lateral dimensions of approximately 0.5 μm and are preferably filled with tungsten using standard tungsten etchback deposition techniques. Insulating layer 106 is preferably a 1.0 μm thick borophosphosilicate glass. Planarizing insulating layer 93 is preferably a 0.5 μm to 1.0 μm thick silicon oxide layer formed by conventional deposition techniques followed by chemical-mechanical polishing.

Pad structure 88 has the capacity to handle relatively high currents between metal interconnection layers 90 and 92 using tungsten-filled via holes 94. Because central portion 114 of planarizing insulating layer 93 does not have a large opening comparable to window 40 (FIG. 1) for forming electrical connections between metal layers, pad structure 88 can be fabricated without creating particle-generating features such as tungsten slivers 42 and 44 (FIG. 1).

Leads are bonded to the surface of metal interconnection layer 92 in pad area 96. The structure directly below metal interconnection layer 92 in pad area 96 is made up of planarizing insulating layer 93 and insulating layer 106, which provide good mechanical support for the bonded lead connection.

Figure 5:
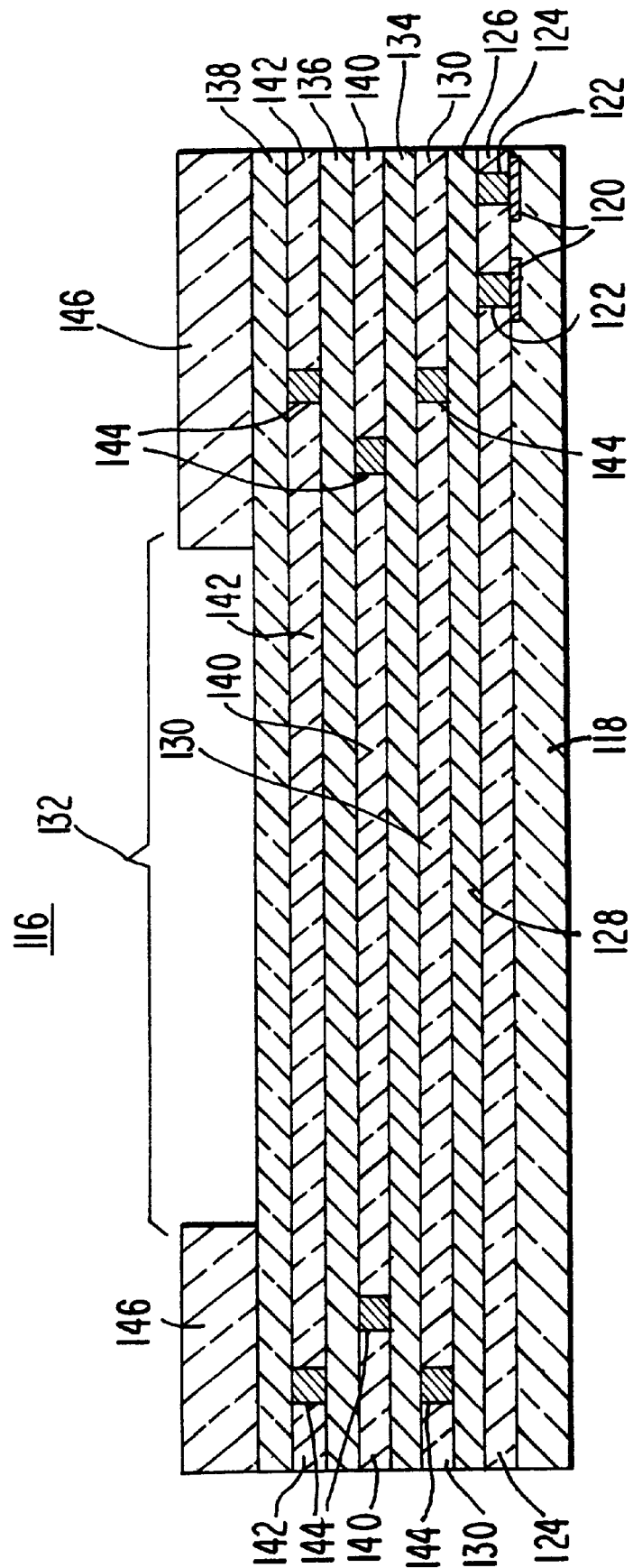
FIG. 5 is a cross sectional view of another pad structure in accordance with the present invention.

Another pad structure arrangement is shown in FIG. 5. Pad structure 116 is formed on silicon substrate 118. Electrical connections are made to active components 120 through metal-filled conductive contact holes 122 in insulating layer 124. Metal interconnection layer 126 is formed on top of insulating layer 124. In contrast to pad structure 88 of FIG. 4, central portion 128 of metal interconnection layer 126 in pad structure 116 is not removed prior to depositing planarizing insulating layer 130. As a result, metal interconnection layer 126 spans pad area 132.

Similar additional metal interconnection layers 134, 136, and 138 are formed on planarizing insulating layers 130, 140, and 142. Tungsten-filled via holes 144 electrically interconnect metal interconnection layers 126, 134, 136, and 138.

If it is desired to handle large currents, such as the currents associated with power distribution, a relatively large number of via holes 144 are provided in the vicinity of the periphery of pad area 132, For example, a multi-row pattern of via holes 144 can be used that is comparable to the pattern of via holes 94 used in pad structure 88 (FIGS. 3 and 4). In addition, extended portions of metal interconnection layers 126, 134, 136, and 138 can be used to form buses comparable to buses 98, 108, and 110 of FIGS. 3 and 4. Elsewhere on the circuit containing pad structure 116, metal interconnection layers 126, 134, 136, and 138 are patterned as needed to form conductive lines for routing electrical signals.

A passivation layer 146 can be deposited and patterned on top of metal interconnection layer 138, Passivation layer 146 may be a 0.6 μm to 0.7 μm thick layer of silicon nitride covered with a 3.0 μm to 4.0 μm thick layer of polyimide. Prior to packaging an integrated circuit containing bonding pad structure 116, electrical contact is made with metal interconnection layer 138 by bonding a lead to metal interconnection layer 138 in pad area 132. Pad area 132 preferably has dimensions of about 100 μm×100 μm.

Metal interconnection layers 126, 134, and 136 are preferably formed using a 0.6 μm to 0.7 μm thick standard metallization layer based on an aluminum alloy. Metal interconnection layer 138 is formed using the same metallization as metal interconnection layers 126, 134, and 136, but preferably has a thickness of 1.0 μm. Contact holes 122 and via holes 144 have lateral dimensions of approximately 0.5 μm and are preferably filled with tungsten plugs using standard tungsten etchback deposition techniques. Insulating layer 124 is preferably a 1.0 μm thick borophosphosilicate glass. Planarizing insulating layers 130, 140, and 142 are preferably 0.5 μm to 1.0 μm thick silicon oxide layers formed by conventional deposition techniques followed by chemical-mechanical polishing.

Figure 6:
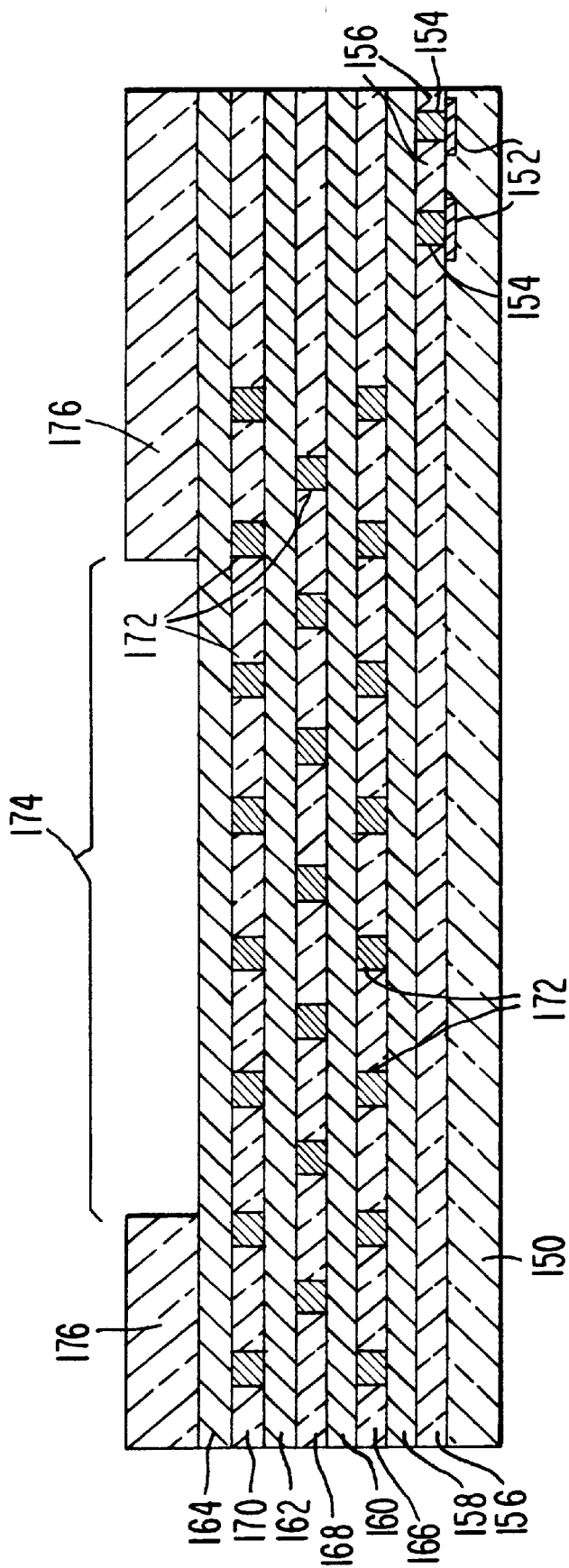
FIG. 6 is a cross sectional view of yet another pad structure in accordance with the present invention.

A pad structure that uses arrays of via holes to connect metal interconnection layers is shown in FIG. 6. Pad structure 148 is formed on silicon substrate 150. Electrical connections are made to active components 152 using tungsten-filled contact holes 154 through insulating layer 156. Metal interconnection layer 158 is deposited on top of insulating layer 156. Metal interconnection layers 160, 162, and 164 are formed on planarizing insulating layers 166, 168, and 170, respectively. Tungsten-filled via holes 172 electrically connect metal interconnection layers 158, 160, 162, and 164.

In each of planarizing insulating layers 166, 168, and 170, vias holes 172 are preferably provided in a 55×55 two-dimensional array spanning pad area 174. Fewer via holes 172 are shown in the cross section of FIG. 6 to avoid over-complicating the drawing. Pad area 174 preferably has lateral dimensions of about 100 $\mu$m×100 $\mu$m. The periphery of pad area 174 is surrounded by passivation layer 176.

Extended portions of metal interconnection layers 158, 160, 162, and 164 can be used to form buses comparable to buses 98, 108, and 110 of FIGS. 3 and 4 when pad structure 148 is used to distribute power. Elsewhere on the circuit containing pad structure 148, metal interconnection layers 158, 160, 162, and 164 are patterned as needed to form conductive lines for routing electrical signals.

Passivation layer 176 may be a 0.6 $\mu$m to 0.7 $\mu$m thick layer of silicon nitride covered with a 3.0 $\mu$m to 4.0 $\mu$m thick layer of polyimide. Prior to packaging an integrated circuit containing pad structure 148, electrical contact is made with metal interconnection layer 164 by bonding a lead in pad area 174.

Metal interconnection layers 158, 160, and 162 are preferably 0.6 $\mu$m to 0.7 $\mu$m thick standard metallization layers based on an aluminum alloy. Metal interconnection layer 164 is formed using the same metallization as metal interconnection layers 158, 160, and 162, but preferably has a thickness of 1.0 $\mu$m. Contact holes 154 and via holes 172 have lateral dimensions of approximately 0.5 $\mu$m and are preferably filled with tungsten plugs using standard tungsten etchback deposition techniques. Insulating layer 156 is preferably a 1.0 $\mu$m thick borophosphosilicate glass. Planarizing insulating layers 166, 168, and 170 are preferably 0.5 $\mu$m to 1.0 $\mu$m thick silicon oxide layers formed by conventional deposition techniques followed by chemical-mechanical polishing.

Figure 7:
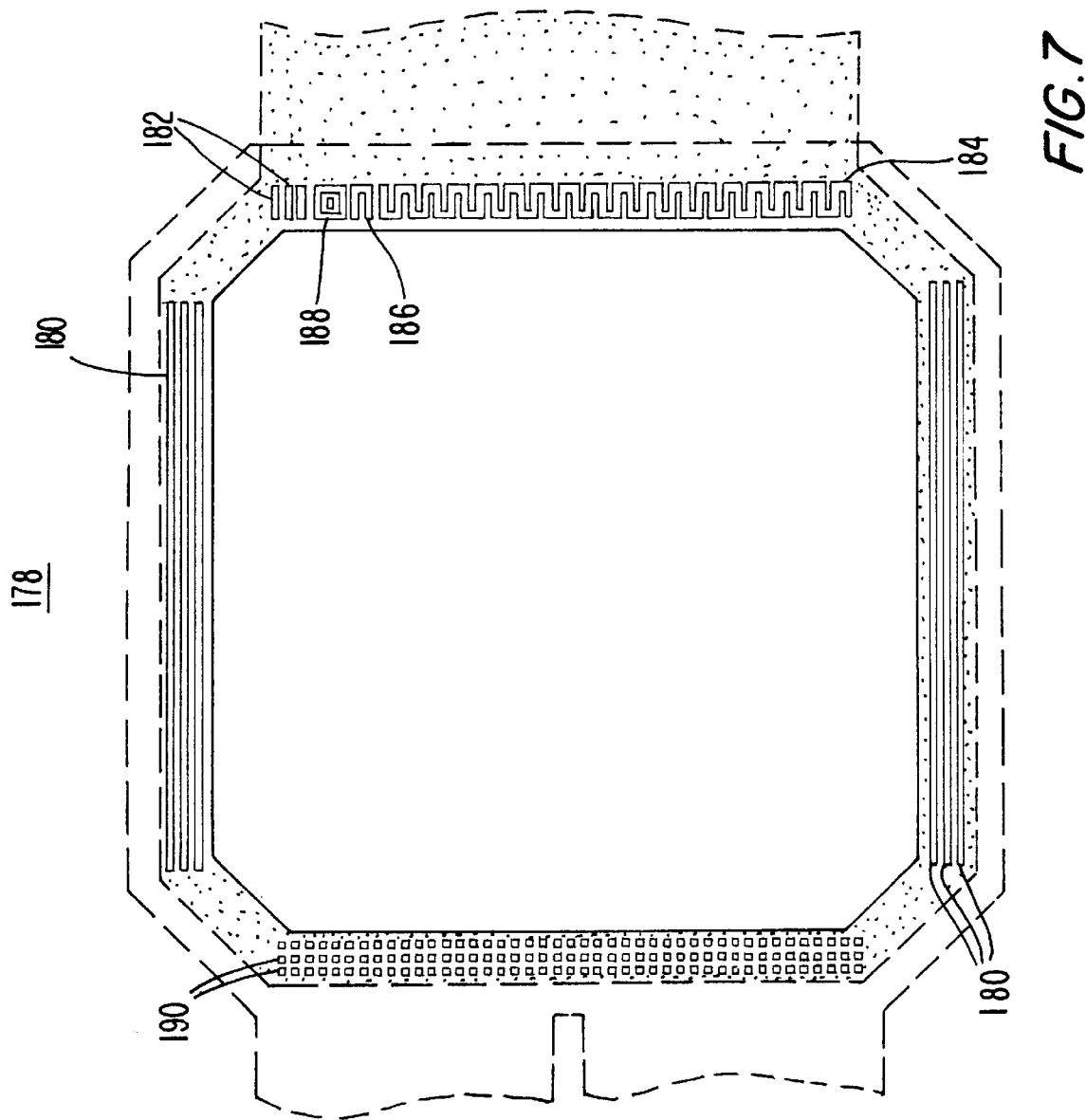
FIG. 7 is a plan view of a pad structure showing various via slot configurations in accordance with the present invention.

A pad structure 178 using via slots is shown in FIG. 7. A variety of via slot configurations may be used. Slots with suitable shapes include long via slots 180, short via slots 182, serpentine via slot 184, U-shaped via slot 186, and ringed via slot 188. Via slots such as those shown in FIG. 7 preferably have one lateral dimension that is on the order of a via hole width (e.g., approximately 0.3 to 0.6 $\mu$m). The other lateral dimension of the via slots may be much larger. The narrowness of via slots 180, 182, 184, 186, and 188 ensures that the via slots are filled with metal during etchback deposition. Accordingly, via slots 180, 182, 184, 186, and 188 can be used in place of or in conjunction with via holes 190 in various pad structures, such as pad structure 45 (FIG. 2), pad structure 88 (FIGS. 3 and 4), pad structure 116 (FIG. 5), and pad structure 148 (FIG. 6).

If desired, a ringed via approach, such as pad structure 45 of FIG. 2, pad structure 88 of FIGS. 3 and 4, and pad structure 116 of FIG. 5, and array of via holes or slots, such as pad structure 148 (FIG. 6), can be combined to form a hybrid layered structure of via holes and slots. Any desired combination of these approaches can be used. For example, one layer can be formed using a patterned metal layer with a pad-sized opening followed by a planarizing insulating layer with a ring of via holes or slots using the structure of metal interconnection layer 54 and planarizing insulating layer 62 shown in FIG. 2. Another layer can be formed using a blanket metal layer followed by a planarizing insulating layer with a ring of via holes or slots using the structure of metal interconnection layer 126 and planarizing insulating layer 130 shown in FIG. 5. Another layer can be formed using a blanket metal layer followed by a planarizing insulating layer with a two-dimensional array of via holes or slots using the structure of metal interconnection layer 158 and planarizing insulating layer 166 shown in FIG. 6.

The number of metal interconnection layers to be used with a pad structure is preferably determined based on the ability of the interconnection layers to accommodate the signal routing tasks of a given circuit design. Circuits with complex routing requirements will generally use the greatest number of metal interconnection layers (i.e., three or more layers). Circuits with relatively modest routing requirements may only require one or, more typically, two metal interconnection layers.

The foregoing is merely illustrative of the principles of this invention and various modifications can be made by those skilled in the art without departing from the scope and spirit of the invention.

What is claimed is:

1. An integrated circuit pad structure having a pad area on the surface of an integrated circuit, the integrated circuit having a semiconductor substrate with a plurality of active components and a surface insulating layer with a plurality of conductive contact holes connected to said active components, the pad structure comprising:

a bottom metal interconnection layer connected to said conductive contact holes;

a bottom insulating layer disposed on said bottom metal interconnection layer and completely covering said pad area, said bottom insulating layer having a plurality of bottom metal-filled via holes connected to said bottom metal interconnection layer; and a top metal interconnection layer substantially covering said pad area, said top metal interconnection layer being electrically connected to said bottom metal interconnection layer at least through said bottom metal-filled via holes, wherein said bottom metal-filled via holes are arranged in a pattern that surrounds the periphery of said pad area.

2. The pad structure defined in claim 1 wherein said bottom metal interconnection layer has a bottom pad opening that spans said pad area.

3. The pad structure defined in claim 2 wherein said bottom pad opening is in the range of 80 to 120 microns by 80 to 120 microns in area.

4. The pad structure defined in claim 1 wherein said bottom metal interconnection layer spans said pad area.

5. The pad structure defined in claim 1 further comprising:

an intermediate metal interconnection layer disposed on said bottom insulating layer, said intermediate metal interconnection layer being electrically connected to said bottom metal-filled via holes; and an intermediate insulating layer disposed on said intermediate metal interconnection layer, said intermediate insulating layer completely covering said pad area and having a plurality of intermediate metal-filled via holes connected to said bottom metal interconnection layer, wherein said top metal interconnection layer is electrically connected to said bottom metal interconnection layer at least through said intermediate metal interconnection layer and said intermediate metal-filled via holes.

6. The pad structure defined in claim 5 wherein said intermediate metal-filled via holes are staggered with respect to said bottom metal-filled via holes.

7. The pad structure defined in claim 1 wherein said bottom metal-filled via holes are filled with tungsten deposited using a tungsten etchback deposition process.

8. The pad structure defined in claim 7 wherein said bottom metal-filled via holes have lateral dimensions in the range of 0.3 to 0.6 microns.

9. The pad structure defined in claim 1 wherein said bottom insulating layer is a silicon oxide layer planarized with a chemical-mechanical polish to a thickness in the range of 0.4 to 1.1 microns.

10. The pad structure defined in claim 1 wherein said bottom metal interconnection layer has a thickness in the range of 0.4 to 0.6 microns.

11. The pad structure defined in claim 1 wherein said top metal interconnection layer has a thickness in the range of 0.9 to 1.1 microns.

12. The pad structure defined in claim 1 further comprising a passivation layer disposed on said top metal interconnection layer, said passivation layer having a passivation layer opening.

13. The pad structure defined in claim 1 wherein said bottom metal interconnection layer further comprises portions that extend outwardly from said pad area to form a bus for distributing power.

14. A method of forming a pad structure having a pad area on the surface of an integrated circuit, the integrated circuit having a semiconductor substrate with a plurality of active components and a surface insulating layer with a plurality of conductive contact holes connected to said active components, the method comprising the steps of:
    forming a bottom metal interconnection layer connected to said conductive contact holes;
    forming a bottom insulating layer disposed on said bottom metal interconnection layer and completely covering said pad area;
    forming a plurality of bottom metal-filled via holes in said bottom insulating layer; and
    forming a top metal interconnection layer substantially covering said pad area, said top metal interconnection layer being electrically connected to said bottom metal interconnection layer at least through said bottom metal-filled via holes, wherein the step of forming said bottom metal-filled via holes further comprises the step of forming said bottom metal-filled via holes in a pattern that surrounds the periphery of said pad area.

15. The method defined in claim 14 wherein said step of forming said bottom metal interconnection layer further comprises the step of providing said bottom metal interconnection layer with a bottom pad opening that spans said pad area.

16. The method defined in claim 15 wherein said step of forming said bottom metal interconnection layer further comprises the step of forming said bottom pad opening with an area in the range of 80 to 120 microns by 80 to 120 microns in area.

17. The method defined in claim 14 wherein the step of forming said bottom metal interconnection layer further comprises the step of forming said bottom metal interconnection layer over said pad area.

18. The method defined in claim 14 further comprising the steps of:
    forming an intermediate metal interconnection layer disposed on said bottom insulating layer, said intermediate metal interconnection layer being electrically connected to said bottom metal-filled via holes;
    forming an intermediate insulating layer disposed on said intermediate metal interconnection layer, said intermediate insulating layer completely covering said pad area; and
    forming a plurality of intermediate metal-filled via holes in said intermediate insulating layer connected to said bottom metal interconnection layer, wherein said top metal interconnection layer is electrically connected to said bottom metal interconnection layer at least through said intermediate metal interconnection layer and said intermediate metal-filled via holes.

19. The method defined in claim 18 wherein the step of forming said intermediate metal-filled via holes comprises the step of staggering said intermediate metal filled via holes with respect to said bottom metal-filled via holes.

20. The method defined in claim 14 wherein said step of forming said bottom metal-filled via holes comprises the step of depositing tungsten using tungsten etchback deposition process.

21. The method defined in claim 20 wherein said step of forming said bottom metal-filled via holes comprises the step of forming said bottom metal-filled via holes with lateral dimensions in the range of 0.3 to 0.6 microns.

22. The method defined in claim 14 wherein said step of forming said bottom insulating layer comprises the steps of:
    forming a silicon oxide layer; and
    planarizing said silicon oxide layer with a chemical-mechanical polish to a thickness in the range of 0.4 to 1.1 microns.

23. The method defined in claim 14 wherein said step of forming said bottom metal interconnection layer comprises the step of forming said bottom metal interconnection layer with a thickness in the range of 0.4 to 0.6 microns.

24. The method defined in claim 14 wherein said step of forming said top metal interconnection layer comprises the step of forming said top metal interconnection layer with a thickness in the range of 0.9 to 1.1 microns.

25. The method defined in claim 14 further comprising the step of forming a passivation layer on said top metal interconnection layer, said passivation layer having a passivation layer opening.

26. The method defined in claim 14 wherein said step of forming said bottom metal interconnection layer further comprises the step of forming a bus for distributing power using portions of said bottom metal interconnection layer that extend outwardly from said pad area.

* * * * *